United States Patent
Sohn et al.

(10) Patent No.: US 8,254,184 B2
(45) Date of Patent: Aug. 28, 2012

(54) SEMICONDUCTOR MEMORY DEVICE HAVING A LATENCY CONTROLLER

(75) Inventors: Young-Soo Sohn, Seoul (KR); Jeong-Don Lim, Seongnam-si (KR); Kwang-Il Park, Yongin-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 178 days.

(21) Appl. No.: 12/820,364

(22) Filed: Jun. 22, 2010

(65) Prior Publication Data

US 2010/0329049 A1    Dec. 30, 2010

(30) Foreign Application Priority Data

Jun. 30, 2009   (KR) .................. 10-2009-0058917

(51) Int. Cl.
  *G11C 7/00*   (2006.01)
  *G11C 5/14*   (2006.01)
  *G11C 8/00*   (2006.01)

(52) U.S. Cl. ............ 365/189.05; 365/194; 365/226; 365/233.11; 365/233.13; 365/233.17; 365/236

(58) Field of Classification Search ......... 365/189.05, 365/194, 233.1, 233.11, 233.13, 233.17, 365/226, 236

See application file for complete search history.

(56) References Cited

U.S. PATENT DOCUMENTS

| | | | | |
|---|---|---|---|---|
| 6,697,926 | B2* | 2/2004 | Johnson et al. | 365/233.1 |
| 6,778,464 | B2* | 8/2004 | Chung | 365/233.1 |
| 6,791,888 | B2* | 9/2004 | Kang | 365/189.05 |
| 6,819,624 | B2* | 11/2004 | Acharya et al. | 365/194 |
| 6,898,139 | B2* | 5/2005 | Lee et al. | 365/233.13 |
| 7,404,018 | B2 | 7/2008 | Dietrich et al. | |
| 7,590,013 | B2* | 9/2009 | Yu et al. | 365/194 |
| 7,869,289 | B2* | 1/2011 | Fujishiro et al. | 365/233.1 |
| 7,876,641 | B2* | 1/2011 | Sasaki | 365/233.1 |
| 7,958,382 | B2* | 6/2011 | Kim et al. | 365/233.1 |
| 7,990,800 | B2* | 8/2011 | Huang | 365/233.1 |

FOREIGN PATENT DOCUMENTS

| | | |
|---|---|---|
| KR | 100803369 | 2/2008 |
| KR | 1020080015591 | 2/2008 |

* cited by examiner

*Primary Examiner* — Trong Phan

(74) *Attorney, Agent, or Firm* — F. Chau & Associates, LLC

(57) ABSTRACT

A semiconductor memory device includes a latency controller which provides a power-saving effect. The latency controller includes a first-in first-out (FIFO) register. After a read command is applied, when a precharge command or power-down command is applied, the latency controller outputs a latency signal corresponding to the applied read command and blocks application of sampling and transmission clock signals to the FIFO register.

16 Claims, 5 Drawing Sheets

SEMICONDUCTOR MEMORY DEVICE HAVING A LATENCY CONTROLLER

CROSS-REFERENCE TO RELATED APPLICATION

This application claims under 35 U.S.C. §119 priority to and the benefit of Korean Patent Application No. 10-2009-0058917, filed on Jun. 30, 2009, the entire content of which is incorporated by reference herein.

BACKGROUND

1. Technical Field

The present disclosure relates to memory devices, and, more particularly, to a semiconductor memory device having a latency controller providing a power-saving effect.

2. Discussion of Related Art

In general, semiconductor memory devices receive an external clock signal and generate at least one clock signal required for their internal operation in response to the external clock signal. A typical synchronous semiconductor memory device provides a latency (i.e., the time it takes to access a particular location in storage) function. A system having the semiconductor memory device may easily use the semiconductor memory device due to the latency function because the semiconductor memory device designates a latency value corresponding to the number of clocks after an external command is applied and before effective data is output.

Thus, when a read command is applied, a semiconductor memory device having a latency function externally outputs data after the number of clocks corresponding to a set latency. However, since the internal clock signal of the semiconductor memory device differs from the external clock signal thereof, the semiconductor memory device needs a latency controller that effectively controls the output timing of data to output the data in synchronization with the external clock signal and that can save power without causing malfunctions when a precharge or power-down command is applied after application of the read command.

SUMMARY

In accordance with an exemplary embodiment of the present inventive concept a semiconductor memory device includes a latency controller that provides a power-saving effect.

An exemplary embodiment includes a semiconductor memory device including a latency controller, the latency controller having a clock generator configured to generate a plurality of transmission clock signals and to generate a plurality of sampling clock signals, each sampling clock signal delayed for a time corresponding to a set read latency with respect to the corresponding one of the transmission clock signals. A first-in first-out (FIFO) register is configured to store an internal read signal in response to at least one sampling clock signal of the sampling clock signals and to generate a latency signal in response to a transmission clock signal corresponding to the sampling clock signal for storing the internal read signal. A clock blocking unit is configured to block application of the sampling clock signal to the FIFO register in response to a power-down signal and to block application of the transmission clock signal to the FIFO register when the power-down signal is applied to the clock blocking unit and the number of times the internal read signal is applied is equal to the number of times the latency signal is applied.

The clock blocking unit may include a power-saving signal generator configured to enable a power-saving command signal when the power-down signal is applied and to enable a power-saving read signal when the power-saving command signal is enabled and the number of times the internal read signal is applied is equal to the number of times the latency signal is applied, a first gate unit including a plurality of sampling switches, each sampling switch configured to block application of the corresponding sampling clock signal to the FIFO register in response to the power-saving command signal, and a second gate unit including a plurality of transmission switches, each transmission switch configured to block application of the corresponding sampling clock signal to the FIFO register in response to the power-saving read signal.

The power-saving signal generator may enable the power-saving command signal in response to a precharge signal.

The power-saving signal generator may include a first counter configured to count the number of times the internal read signal is enabled in response to the internal clock signal and to output a first counting value, a second counter configured to count the number of times the latency signal is enabled in response to a data output clock signal and to output a second counting value, a comparator configured to enable an equivalent signal when the first and second counting values are equal, an OR gate configured to perform a logic OR on the precharge signal and the power-down signal and to enable the power-saving command signal, and an AND gate configured to perform a logic AND on the power-saving command signal and the equivalent signal and to enable the power-saving read signal.

The FIFO register may include a plurality of input switches, each input switch configured to transmit the internal read signal in response to the corresponding one of the sampling clock signals applied from the first gate unit, a plurality of buffers, each buffer configured to store the internal read signal applied from the corresponding one of the input switches and to be reset in response to the power-saving read signal, and a plurality of output switches, each output switch configured to receive the stored internal read signal from the corresponding one of the buffers in response to the corresponding one of the transmission clock signals applied from the second gate unit and to output the stored internal read signal as the latency signal.

The semiconductor memory device includes a memory cell array including a plurality of memory cells interposed between a plurality of word lines and a plurality of bit lines, a row decoder configured to decode a row address and to enable the corresponding one of the word lines, a column decoder configured to decode a column address and to select a predetermined number of bit lines out of the bit lines, a clock synchronous circuit configured to receive an external clock signal and to generate the internal clock signal and the data output clock signal, a command decoder configured to decode an externally applied command and to output the internal read signal, the precharge signal, the power-down signal, and a mode register set (MRS) signal, a mode-setting unit configured to externally receive a mode-setting code in response to the MRS signal and to set the read latency, and a data input/output (I/O) unit configured to output data from the memory cell array, in response to the latency signal.

The clock generator may include the transmission clock generator configured to output transmission clock signals that sequentially toggle in response to the data output clock signal and the set read latency, a reproduction delay unit configured to receive one of the transmission clock signals, to delay the received transmission clock signal for a time corresponding to the sum of a read delay time and an output delay time, and to output a delay clock signal, and a sampling clock generator including a plurality of sampling flip-flops connected in cascade and configured to sequentially delay the delay clock signal and to output the sampling clock signals in response to the internal clock.

The transmission clock generator may include a plurality of transmission flip-flops connected in cascade, each transmission flip-flop configured to output the corresponding one of the transmission clock signals in response to the data output clock signal, and a plurality of latency switches, each latency switch configured to apply the transmission clock signal, which is applied from the corresponding one of the transmission flip-flops, to a first-stage transmission flip-flop in response to the set read latency.

The sampling clock generator may include a plurality of sampling flip-flops connected in cascade and configured to sequentially delay the delay clock signal in response to the internal clock signal and to output the respectively corresponding sampling clock signals.

The sampling clock generator may include the sampling flip-flops provided in a number corresponding to a maximum value of the read latency, and the transmission clock generator includes the transmission flip-flops provided in the number corresponding to the maximum value of the read latency.

According to an exemplary embodiment a semiconductor memory device includes a memory cell array having a plurality of memory cells interposed between a plurality of word lines and a plurality of bit lines to store data. A data input/output unit is coupled to the memory cell array and is configured to output data from a memory cell of the memory cell array in response to a read command applied to the semiconductor memory device. A latency controller controls the output of data from the data input/output unit and includes a first-in first-out register coupled to the data input/output unit. Upon the read command being applied to the semiconductor memory device, the latency controller is configured to control the output of data from the data input/output unit by outputting from the first-in first-out register to the data input/output unit a latency signal based upon a set read latency for the semiconductor memory device and corresponding to the applied read command.

The latency controller may further include a transmission clock signal generator coupled to the first-in first-out register that provides transmission clock signals to the first-in first-out register in response to a data output internal clock signal based upon an external clock signal, and a sampling clock generator coupled to the first-in first-out register that provides sampling clock signals to the first-in first out register in response to a delayed clock signal based upon a delayed first transmission clock signal.

The semiconductor memory device may further include a first gate unit coupled between the sampling clock generator and the first-in first-out register, and a second gate unit coupled between the transmission clock generator and the first-in first-out register. Upon the read command being applied to the semiconductor memory device and in response to a precharge command or a power-down command, the first gate unit is configured to block application of the sampling clock signals to the first-in first-out register and the second gate unit is configured to block application of the transmission clock signals to the first-in first-out register.

The semiconductor memory device may further include a command decoder for providing an internal read signal to the latency controller based upon the read command. The first-in first-out register is configured to sample the internal read signal and store the sampled signal in response to the sampling clock signals and output the stored sampled signal as the latency signal in response to the transmission clock signals.

The delayed clock signal may be delayed by the latency controller for a time corresponding to a set read latency with respect to a corresponding one of the transmission clock signals.

The first transmission clock signal may be delayed by a delay time corresponding to a sum of a read delay time and a data output delay time, the read delay time being a time taken for the command decoder to output the internal read signal in response to the read command, and the data output delay time being a time taken for the data input/output unit to externally output data received from the memory cell array.

BRIEF DESCRIPTION OF THE DRAWINGS

Exemplary embodiments are described in further detail below with reference to the accompanying drawings.

DETAILED DESCRIPTION OF THE EMBODIMENTS

Various exemplary embodiments will now be described more fully with reference to the accompanying drawings.

Figure 1:
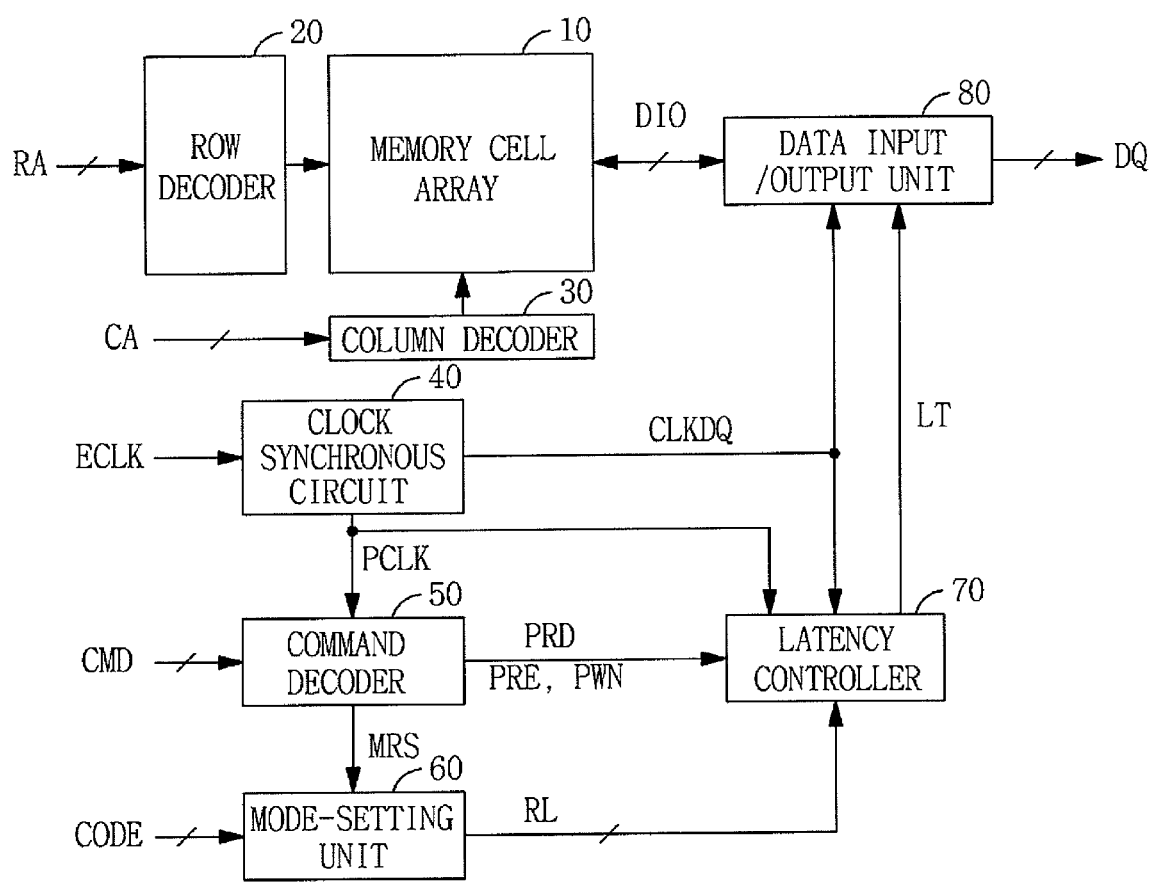
FIG. 1 is a diagram of a semiconductor memory device according to an exemplary embodiment.

FIG. 1 is a diagram of a semiconductor memory device according to an exemplary embodiment of the present inventive concept. The semiconductor memory device may include a memory cell array 10, a row decoder 20, a column decoder 30, a clock synchronous circuit 40, a command decoder 50, a mode-setting unit 60, a latency controller 70, and a data input/output (I/O) unit 80.

The memory cell array 10 may include a plurality of memory cells interposed between a plurality of word lines and a plurality of bit lines to store data. The row decoder 20 may receive a row address RA out of externally applied addresses, decode the row address RA, and enable a word line corresponding to the received row address RA out of the word lines of the memory cell array 10. The column decoder 30 may receive a column address CA out of the externally applied addresses, decode the column address CA, and select a bit line corresponding to the received column address CA out of the bit lines. The memory cell array 10 may output data from a memory cell connected between the enabled word line and the selected bit line to the data I/O unit 80 or store data from the data I/O unit 80 in the memory cell.

The clock synchronous circuit 40 may receive an external clock signal ECLK and generate at least one internal clock signal PCLK and a data output clock signal CLKDQ. The internal clock signal PCLK may be applied to various internal circuits of the semiconductor memory device, which perform designated operations in synchronization with the internal clock signal PCLK. Also, the data output clock signal CLKDQ may be applied to the latency controller 70 and the data I/O unit 80. The command decoder 50 may receive an external command CMD, decode the external command CMD, and output an internal read signal PRD, a precharge signal PRE and a power-down signal PWN to the latency controller 70. Also, the command decoder 50 may output a mode register set (MRS) signal MRS to the mode-setting unit 60. The mode-setting unit 60 may externally receive a mode-setting code CODE, which is applied in an address or data format, in response to the MRS signal MRS and store various settings of the semiconductor memory device including read latency RL.

When the internal read signal PRD is applied from the command decoder 50 to the latency controller 70, the latency controller 70 may enable a latency signal LT in response to read latency RL set by the mode-setting unit 60 and output the enabled latency signal LT to the data I/O unit 80. In this case, the internal read signal PRD is applied in synchronization with the internal clock signal PCLK, whereas the latency signal LT may be output in synchronization with a data output clock signal CLKDQ. That is, the latency controller 70 may receive the internal clock signal PCLK and the data output clock signal CLKDQ, which have different clock domains, delay the internal read signal PRD, which is applied in synchronization with the internal clock signal PCLK, and output the latency signal LT in synchronization with the data output clock signal CLKDQ. Thereafter, the latency controller 70 may receive the precharge signal PRE and the power-down signal PWN to reduce power consumption.

In response to the enabled latency signal LT, the data I/O unit 80 may receive data DIO from the memory cell array 10 and externally output the data DIO or receive externally applied data DQ and provide the data DQ to the memory cell array 10.

Figure 2:
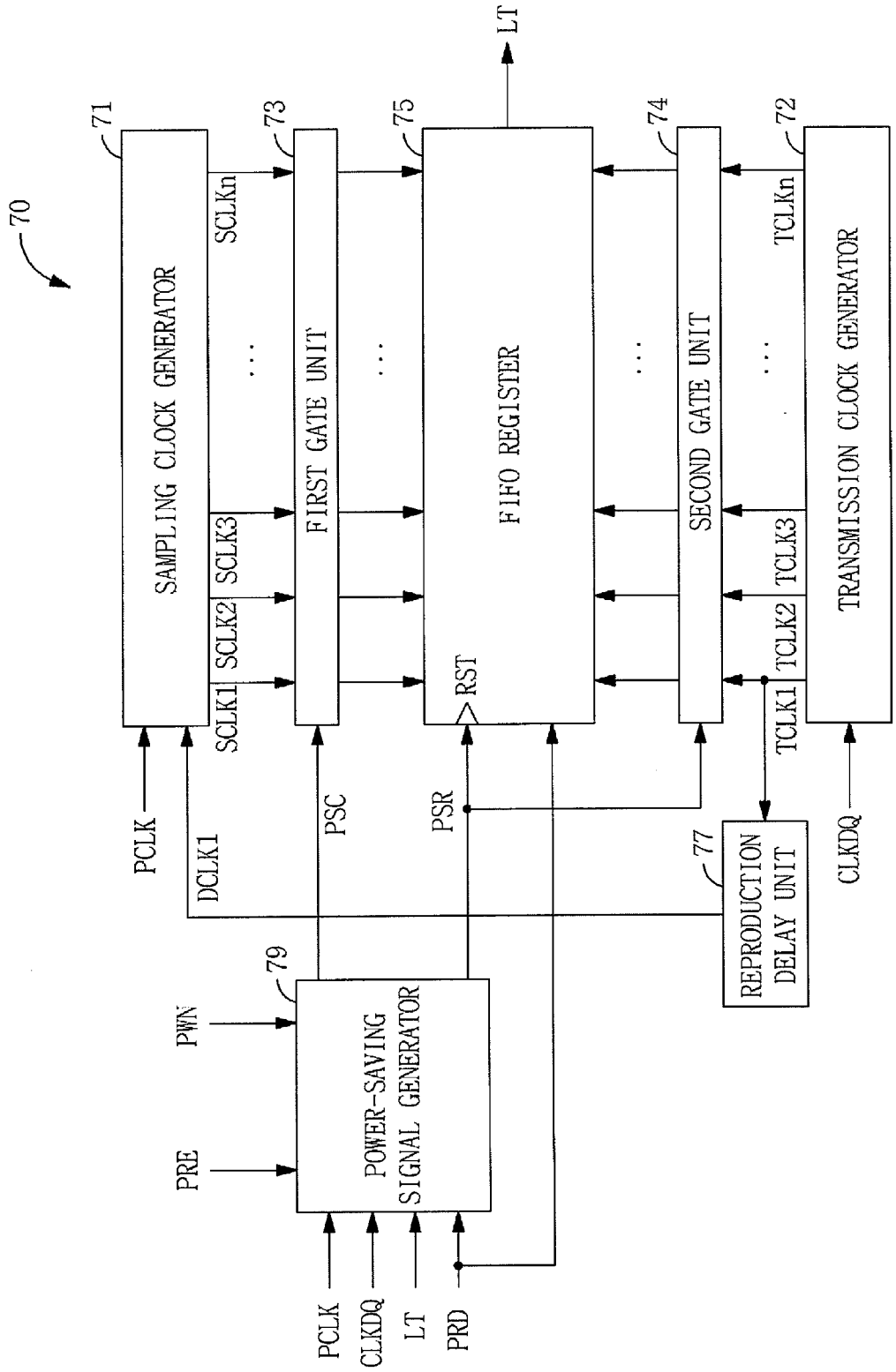
FIG. 2 is a diagram of a latency controller of FIG. 1, according to an exemplary embodiment.

FIG. 2 is a diagram of the latency controller of FIG. 1, according to an exemplary embodiment.

The latency controller 70 of FIG. 2 will now be described with reference to FIG. 1. The latency controller 70 may include sampling and transmission clock generators 71, 72, a first-in first-out (FIFO) register 75, first and second gate units 73, 74 interposed between the clock generators 71, 72 and the FIFO register 75, respectively, a reproduction delay unit 77, and a power-saving signal generator 79 so that the latency controller 79 can control the timing of the latency signal LT, which is output in synchronization with the data output clock CLKDQ, in response to the internal read signal PRD synchronized with the internal clock signal PCLK having a different clock domain.

The transmission clock generator 72, which may have an initial value, may receive the data output clock signal CLKDQ, sequentially delay the data output clock signal CLKDQ, and generate and output n transmission clock signals TCLK1, TCLK2, TCLK3, ... TCLKn in synchronization with the data output clock signal CLKDQ. Here, n is a natural number corresponding to the maximum settable read latency of the semiconductor memory device. That is, the transmission clock generator 72 must be able to generate the transmission clock signals TCLK1, TCLK2, TCLK3, ... TCLKn corresponding to the settable read latency RL of the semiconductor memory device. However, since the read latency RL of the semiconductor memory device is settable by the mode-setting unit 60, when the set read latency RL is smaller than the maximum settable read latency, the transmission clock generator 72 may output transmission clock signals in a number corresponding to the set read latency RL. For example, assuming that the maximum settable read latency is 10 and the set read latency RL is 7, although the transmission clock generator 72 should be able to generate and output ten transmission clock signals TCLK1, ... TCLK10, the transmission clock generator 72 may actually generate and output only 7 transmission clock signals TCLK1, ... TCLK7. Also, when the set read latency RL is 7, each of the transmission clock signals TCLK1, ... TCLK7 may be clocked once at intervals of seven cycles of the data output clock signal CLKDQ. Similarly, when the set read latency RL is 10, each of the transmission clock signals TCLK1, TCLK10 may be clocked once at intervals of 10 cycles of the data output clock signal CLKDQ.

The reproduction delay unit 77 may receive the first transmission clock signal TCLK1, delay the first transmission clock signal TCLK1 by a delay time corresponding to the sum of a read delay time tRD and a data output delay time tSAC, and output a delay clock signal DCLK1 to the sampling clock generator 71. Here, the read delay time tRD may be a time taken for the command decoder 50 to output the internal read signal PRD in response to an external command CMD. Also, the data output delay time tSAC may be a time taken for the data I/O unit 80 to externally output data received from the memory cell array 10.

The sampling clock generator 71 may sequentially delay the delay clock signal DCLK1 applied from the reproduction delay unit 77 and generate and output n sampling clock signals SCLK1, SCLK2, SCLK3, ... SCLKn in synchronization with the internal clock signal PCLK. Like the transmission clock signals TCLK1, TCLK2, TCLK3, ... TCLKn, when the set read latency RL is 7, each of the sampling clock signals SCLK1, SCLK2, SCLK3, ... SCLKn may be clocked once at intervals of 7 cycles of the internal clock signal PCLK.

The power-saving signal generator 79 may receive the internal clock signal PCLK, the data output clock signal CLKDQ, the read signal PRD, and the latency signal LT and confirm whether or not the latency signal LT corresponding to the applied read signal PRD is output. In addition, the power-saving signal generator 79 may generate a power-saving command signal PSC and a power-saving read signal PSR in response to the precharge signal PRE and the power-down signal PWN.

The first gate unit 73 may block application of the sampling clock signals SCLK1, SCLK2, SCLK3, ... SCLKn from the sampling clock generator 71 to the FIFO register 75 in response to the power-saving command signal PSC. The second gate unit 74 may block application of the transmission clock signals TCLK1, TCLK2, TCLK3, ... TCLKn from the transmission clock generator 72 to the FIFO register 75 in response to the power-saving read signal PSR.

The FIFO register 75 may sample the internal read signal PRD and store the sampled signal in response to the sampling clock signals SCLK1, SCLK2, SCLK3, ... SCLKn and output the stored sampled signal as the latency signal LT in response to the transmission clock signals TCLK1, TCLK2, TCLK3, ... TCLKn. Also, the FIFO register 75 may rest the stored sampled signal in response to the power-saving read signal PSR.

Figure 3:
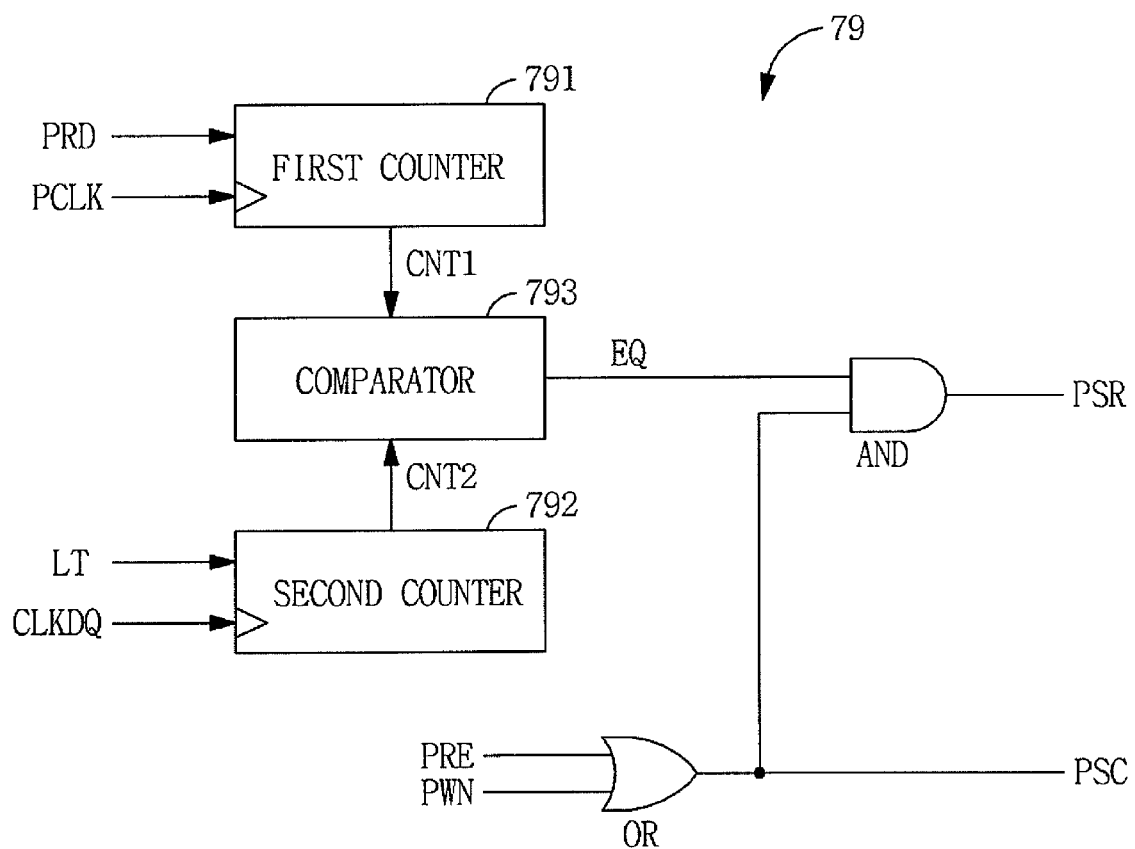
FIG. 3 is a diagram of a power-saving signal generator of FIG. 2, according to an exemplary embodiment.

FIG. 3 is a diagram of the power-saving signal generator 79 of FIG. 2, according to an exemplary embodiment. The power-saving signal generator 79 may include first and second counters 791, 792, a comparator 793, an AND gate AND, and an OR gate OR. The first counter 791 may count the internal read signal PRD in response to the internal clock signal PCLK, and the second counter 792 may count the latency signal LT in response to the data output clock signal CLKDQ. The comparator 793 may compare first and second counting values CNT1, CNT2, which are output by the first and second counters 791, 792, respectively. Thus, when the two counting values CNT1, CNT2 are equal, the comparator 793 may enable and output an equivalent signal EQ. When the precharge signal PRE or the power-down signal PWN is applied from the command decoder 50, the OR gate OR may enable and output the power-saving command signal PSC, and the AND gate may perform a logic AND on the equivalent signal EQ and the power-saving command signal PSC, and enable and output the power-saving read signal PSR. During a precharge or power-down operation of the semiconductor memory device, when the first and second gate units 73, 74 directly receive the precharge signal PRE or the power-down signal PWN and cut off the sampling clock signals SCLK1, SCLK2, SCLK3, . . . SCLKn and the transmission clock signals TCLK1, TCLK2, TCLK3, . . . TCLKn, which are applied to the FIFO register 75, in response to the precharge signal PRE or the power-down signal PWN in order to reduce power consumption, data delayed by the read latency RL may not be output, thereby causing a malfunction in the semiconductor memory device.

In order to prevent occurrence of the malfunction, the power-saving signal generator 79 may include the first and second counters 791, 792, and the comparator 793 may compare the first and second counting values CNT1, CNT2, which are output by the first and second counters 791, 792, respectively, and enable the equivalent signal EQ. The first counting value CNT1 may designate the number of generated internal read signals PRD, and the second counting value CNT2 may designate the number of generated latency signals LT. Thus, the enabling of the equivalent signal EQ may mean that the first counting value CNT1 is equal to the second counting value CNT2 and all the latency signals LT corresponding to the generated internal read signals PRD are output. Therefore, since all data to be output by the semiconductor memory device are output, even if the first and second gate units 73, 74 block the application of the sampling clock signals SCLK1, SCLK2, SCLK3, . . . SCLKn and the transmission clock signals TCLK1, TCLK2, TCLK3, . . . TCLKn to the FIFO register 75, the semiconductor memory device may not cause malfunctions.

Figure 4:
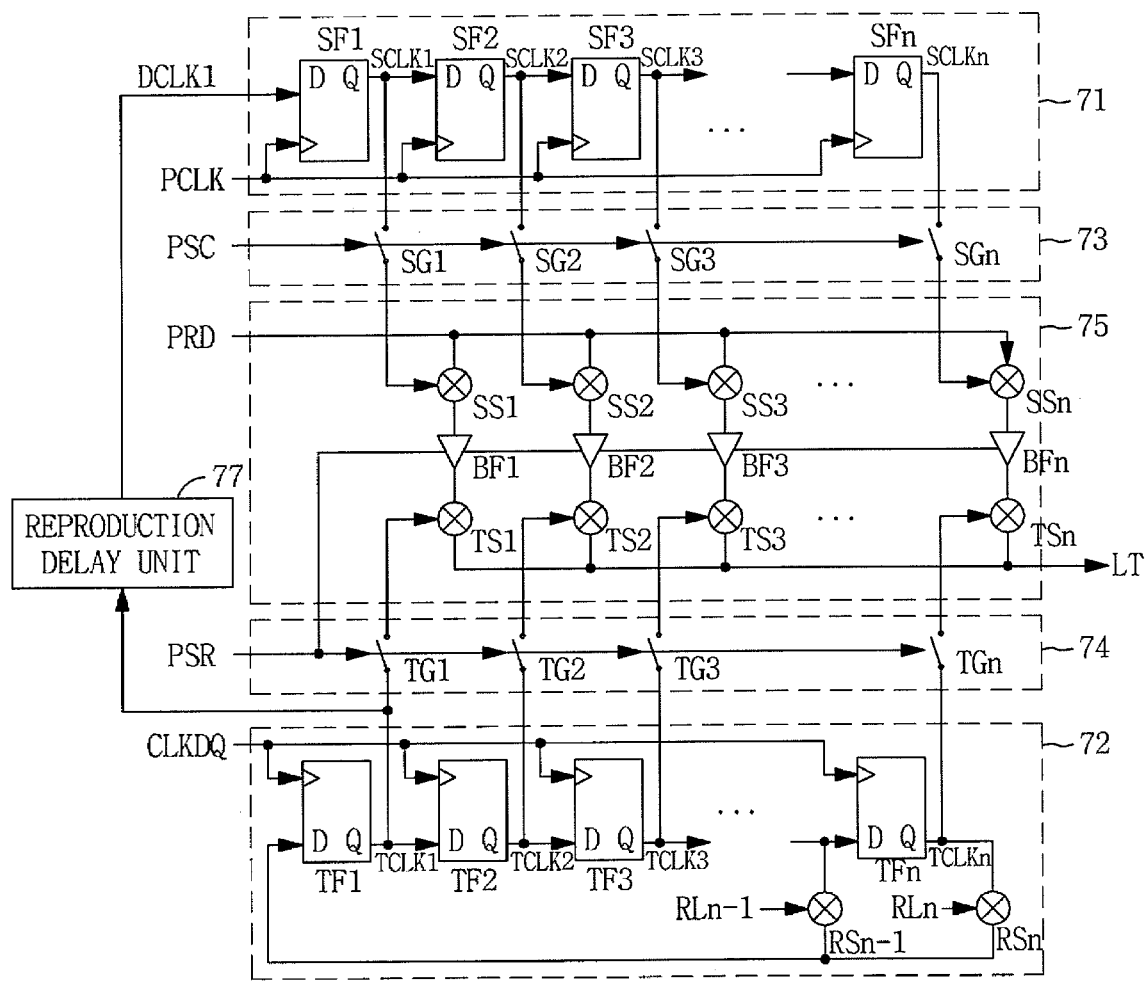
FIG. 4 is a detailed circuit diagram of the latency controller of FIG. 2.

FIG. 4 is a detailed circuit diagram of the latency controller 70 of FIG. 2. Here, since the power-saving signal generator 79 is omitted from FIG. 4, its configuration and function may be understood with reference to FIG. 2.

The transmission clock generator 72 may include n transmission flip-flops TF1, TF2, TF3, . . . TFn, which are connected in cascade as a ring type. The n transmission flip-flops TF1, TF2, TF3, . . . TFn may sequentially delay previously stored initial transmission clock signals TCLK1, TCLK2, TCLK3, . . . TCLKn in response to the data output clock signal CLKDQ and output the delayed transmission clock signals TCLK1, TCLK2, TCLK3, . . . TCLKn. As described above, the transmission flip-flops TF1, TF2, TF3, . . . TFn may be provided in a number corresponding to the maximum settable read latency of the semiconductor memory device. Each of the transmission flip-flops TF1, TF2, TF3, . . . TFn may latch transmission clock signals TCLK1, TCLK2, TCLK3, . . . TCLKn−1, which are applied to the flip flops' D input from a front-stage transmission flip-flop of the transmission flip-flops TF1, TF2, TF3, . . . TFn−1, and output from the flip flops' Q output the latched transmission clock signals TCLK1, TCLK2, TCLK3, TCLKn−1 to a next-stage transmission flip-flop of the transmission flip-flops TF2, TF3, . . . TFn. However, the semiconductor memory device may set latency in a system including the semiconductor memory device. That is, the read latency RL may vary at the request of the system. Accordingly, the transmission clock generator 72 must be able to control the number of the output transmission clock signals TCLK1, TCLK2, TCLK3, . . . TCLKn according to the read latency RL. In order to control the number of the transmission clock signals TCLK1, TCLK2, TCLK3, . . . TCLKn, the transmission clock generator 72 of FIG. 4 may include a plurality of latency switches RSn−1, RSn. The latency switches RSn−1, RSn may respectively receive the read latency values RLn−1, RLn and respectively output the transmission clock signals TCLKn−1, TCLKn, which are applied from the transmission flip-flops TFn−1, TFn, to the first transmission flip-flop TF1. That is, out of the n transmission flip-flops TF1, TF2, TF3, . . . TFn included in the transmission clock generator 72, only a designated number of the transmission flip-flops corresponding to the read latency RL may be connected in cascade as a ring type. When the read latency RL set by the mode-setting unit 60 is 6, the latency switch RS6 corresponding to the sixth transmission flip-flop TF6 may receive the transmission clock signal TCLK6 and output the transmission clock signal TCLK6 to the first transmission flip-flop TF1. Thus, the six transmission flip-flops TF1, . . . TF6 may be connected as a ring type. Although n of the latency switches RS may be provided to correspond respectively to the transmission flip-flops TF1, TF2, TF3, . . . TFn, a typical semiconductor memory device may require at least a predetermined number of clock signals to output data during a read operation, and the read latency RL cannot be set to a smaller value than the predetermined number of the clock signals. Thus, the latency switches RS corresponding to the read latency RL smaller than the predetermined number of clock signals may be unnecessary. For example, when a semiconductor memory device requires at least 5 clock signals, the latency switches RS may be provided in a number corresponding to each of the fifth transmission flip-flop TF5 to the transmission flip-flop TFn corresponding to the maximum settable read latency.

As described above, the reproduction delay unit 77 may receive the first transmission clock signal TCLK1 and delay the first transmission clock signal TCLK1 by the sum of the read delay time tRD and the output delay time tSAC, and output a delay clock signal DCLK1. Since the reproduction delay unit 77, which functions only to delay the first transmission clock signal TCLK1 and output the delay clock signal DCLK1, may be embodied by various delay devices known to those skilled in the art, a detailed circuit thereof is not shown.

The sampling clock generator 71 may include n sampling flip-flops SF1, SF2, SF3, . . . SFn that are connected in cascade. The n sampling flip-flops SF1, SF2, SF3, . . . SFn may sequentially delay the delay clock signal DCLK1 in response to the internal clock signal PCLK and output delayed signals. Specifically, a first sampling flip-flop SF1 of the n sampling flip-flops SF1, SF2, SF3, . . . SFn may receive the delay clock signal DCLK1 at its D input, and each of second through $n^{th}$ sampling flip-flops SF2, SF3, . . . SFn may receive the sampling clock signals SCLK1, SCLK2, SCLK3, . . . SCLKn−1 at its D input from a front-stage sampling flip-flop of the sampling flip-flops SF1, SF2, SF3, . . . SFn−1, latch the sampling clock signals SCLK1, SCLK2, SCLK3, SCLKn−1, and output at its Q output the latched sampling clock signals SCLK1, SCLK2, SCLK3, . . . SCLKn−1 to a next-stage sampling flip-flop of the sampling flip-flops SF3, SFn. The n sampling flip-flops SF1, SF2, SF3, . . . SFn output the latched the sampling clock signals SCLK1, SCLK2, SCLK3, . . . SCLKn to n first switches SG1, SG2, SG3, . . . SGn, respectively.

The first gate unit 73 may include n first switches SG1, SG2, SG3, . . . SGn. Each of the n first switches SG1, SG2, SG3, . . . SGn may block application of the corresponding one of the sampling clock signals SCLK1, SCLK2, SCLK3, . . . SCLKn to the FIFO register 75 in response to the power-saving command signal PSC. Also, the second gate unit 74 may include n second switches TG1, TG2, TG3, . . . TGn.

Each of the n second switches TG1, TG2, TG3, ... TGn may block application of the corresponding one of the transmission clock signals TCLK1, TCLK2, TCLK3, ... TCLKn to the FIFO register 75 in response to the power-saving read signal PSR. That is, the first gate unit 73 may block application of the sampling clock signals SCLK1, SCLK2, SCLK3, ... SCLKn to the FIFO register 75 in response to the power-saving command signal PSC, and the second gate unit 74 may block application of the transmission clock signals TCLK1, TCLK2, TCLK3, ... TCLKn to the FIFO register 75 in response to the power-saving read signal PSR. Thus, the first and second gate units 73, 74 may block the FIFO register 75 from performing unnecessary operations, thereby saving power.

The FIFO register 75 may include n input switches SS1, SS2, SS3, ... SSn, n output switches TS1, TS2, TS3, ... TSn, and n buffers BF1, BF2, BF3, ... BFn. Each of the n input switches SS1, SS2, SS3, ... SSn may sample the internal read signal PRD in response to the corresponding one of the sampling clock signals SCLK1, SCLK2, SCLK3, ... SCLKn and output the sampled signal. Each of the n buffers BF1, BF2, BF3, ... BFn may store a signal applied from the corresponding one of the input switches SS1, SS2, SS3, ... SSn and reset the stored signal in response to the power-saving read signal PSR. Each of the n output switches TS1, TS2, TS3, ... TSn may output data, which is stored in the corresponding one of the buffers BF1, BF2, BF3, ... BFn, as the latency signal LT in response to the corresponding one of the transmission clock signals TCLK1, TCLK2, TCLK3, ... TCLKn.

Figure 5:
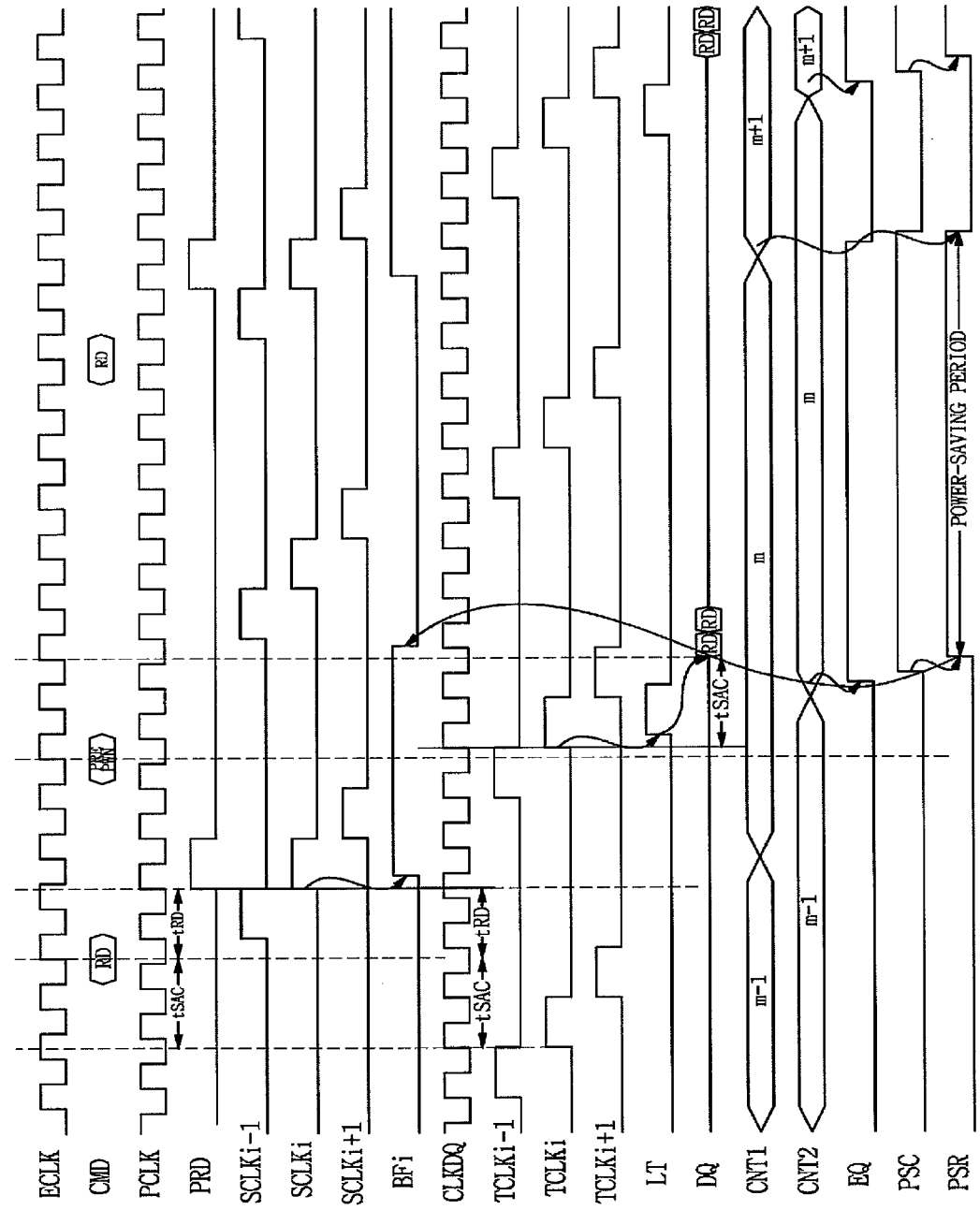
FIG. 5 is a timing diagram illustrating operation of the latency controller of FIG. 2, according to an exemplary embodiment.

FIG. 5 is a timing diagram illustrating the operation of the latency controller 70 of FIG. 2, according to an exemplary embodiment.

When the semiconductor memory device is enabled, the clock synchronous circuit 40 may generate the internal clock signal PCLK and the data output clock signal CLKDQ, output the internal clock signal PCLK to the command decoder 50, and output the data output clock signal CLKDQ to the latency controller 70 and the data I/O unit 80.

When a MRS command is externally applied in synchronization with the external clock signal ECLK, the command decoder 50 may output the MRS signal MRS to the mode-setting unit 60, and the mode-setting unit 60 may receive the mode-setting code CODE and store setting information of the semiconductor memory device, which includes the read latency RL. In FIG. 5, it is assumed that the maximum settable read latency of the semiconductor memory device is 10 and the read latency RL of the semiconductor memory device is set to 6.

Also, the transmission clock generator 72 of the latency controller 70 may generate and output six transmission clock signals TCLK1, TCLK2, TCL3, ... TCLK6 in response to the data output clock signal CLKDQ. Since the read latency RL of the semiconductor memory device is set to 6, the transmission clock generator 72 may generate the six transmission clock signals TCLK1, TCLK2, TCLK3, ... TCLK6.

The reproduction delay unit 79 may receive the first transmission clock signal TCLK1 out of the transmission clock signals TCLKi−1, TCLKi, TCLKi+1, e.g., six transmission clock signals, TCLK1, TCLK2, TCLK3, ... TCLK6, delay the first transmission clock signal TCLK1 by the sum of the read delay time tRD and the output delay time tSAC, and output the delay clock signal DCLK1 to the sampling clock generator 71.

The sampling clock generator 71 may sequentially delay the delay clock signal DCLK1 in response to the internal clock signal PCLK and generate and output sampling clock signals SCLKi−1, SCLKi, SCLKi+1, e.g., 10 sampling clock signals SCLK1, SCLK2, SCLK3, ... SCLK10. Unlike the transmission clock generator 72, since the sampling clock generator 71 does not receive the read latency RL, the sampling clock generator 71 may output 10 sampling clock signals SCLK1, SCLK2, SCLK3, ... SCLK10 corresponding to the maximum settable read latency.

When the read command RD is externally applied in synchronization with the external clock signal ECLK, the command decoder 50 may decode the read command RD and output the internal read signal PRD after the elapse of the read delay time tRD.

The power-saving signal generator 79 of the latency controller 70 may increase the first counting value CNT1 by 1 in response to the internal read signal PRD. However, since the latency signal LT is not enabled, the second counting value CNT2 may maintain a previous state and have a value that is smaller than the first counting value CNT1 by 1. Thus, the equivalent signal EQU may be disabled. Also, since neither the precharge signal PRE nor the power-down signal PWN is applied to the power-saving signal generator 79, the power-saving signal generator 79 may not enable the power-saving command signal PSC and the power-saving read signal PSR. Thus, the first gate unit 73 may transmit the sampling clock signals SCLK1, SCLK2, SCLK3, ... SCLK10 to the FIFO register 75, and the second gate unit 74 may transmit the transmission clock signals TCLK1, TCLK2, TCLK3, ... TCLK6 to the FIFO register 75.

Each of the input switches SS1, SS2, SS3, ... SS10 of the FIFO register 75 may sample the internal read signal PRD in response to the corresponding one of the sampling clock signals SCLK1, SCLK2, SCLK3, ... SCLK10 and store upon a BFi signal the sampled signal in the corresponding one of the buffers BF1, BF2, BF3, ... BF10. In this case, in response to the internal read signal PRD, first-level data may be stored in only one buffer BF6, while second-level data may be stored in the remaining buffers BF1, BF2, BF3, BF4, BF5 and buffers BF7, BFB, BF9, BF10. Here, it is assumed that the first level is a high level, and the second level is a low level. Also, each of the six output switches TS1, TS2, TS3, ... TS6 out of the output switches TS1, TS2, TS3, ... TS10 may receive data, which is stored in the corresponding one of the buffers BF1, BF2, BF3, ... BF6, in response to the corresponding one of the transmission clock signals TCLK1, TCLK2, TCLK3, ... TCK6 and output the data. Since the six transmission clock signals TCLK1, TCLK2, TCLK3, ... TCK6 sequentially toggle and are applied and the first-level data is stored in only the sixth buffer BF6, when the sixth transmission clock signal TCLK6 toggles, the latency signal LT may be enabled and output by the output switch TS6.

The row decoder 20 and the column decoder 30 may decode the row address RA and the column address CA, respectively, and enable at least one of the memory cells of the memory cell array 10. Also, the memory cell array 10 may output data DIO from the enabled memory cell to the data I/O unit 80.

The data I/O unit 80 may buffer the data DIO applied from the memory cell array 10 and externally output the buffered data DQ in response to the enabled latency signal LT.

When the latency signal LT is enabled, the power-saving signal generator 79 may increase the second counting value CNT2 by 1. As a result, the first counting value CNT1 may have the same value m (m is a natural number) as the second counting value CNT2. Thus, the equivalent signal EQ may be enabled.

Also, even if the data DQ corresponding to the previous read command RD is not externally output yet, when a precharge or power-down command is externally applied, the command decoder 50 may generate and output the precharge signal PRE or the power-down signal PWN, and the OR gate OR of the power-saving signal generator 79 may enable and output the power-saving command signal PSC. Also, when the power-saving command signal PSC and the equivalent signal EQ are enabled, since the latency signal LT is output in response to the previously applied read command RD, the AND gate AND may enable and output the power-saving read signal PSR.

In response to the power-saving command signal PSC, the sampling switches SG1, SG2, SG3, . . . SG10 of the first gate unit 73 may block application of the sampling clock signals SCLK1, SCLK2, SCLK3, . . . SCLK10 to the FIFO register 75. Also, in response to the power-saving read signal PSR, the transmission switches TG1, TG2, TG3, . . . TG10 of the second gate unit 74 may block application of the transmission clock signals TCLK1, TCLK2, TCLK3, . . . TCLK10 to the FIFO register 75. Thus, the first and second gate units 73, 74 may block the FIFO register 75 from performing unnecessary operations, thereby saving power.

Afterwards, when the read command RD is applied again, the equivalent signal EQ, the power-saving command signal PSC, and the power-saving read signal PSR may all be disabled, and the first and second gate units 73, 74 may respectively apply the sampling clock signals SCLK1, SCLK2, SCLK3, . . . SCLK10 and the transmission clock signals TCLK1, TCLK2, TCLK3, . . . TCLK10 to the FIFO register 75.

As described above, a semiconductor memory device according to an exemplary embodiment may include a latency controller, which may output a latency signal corresponding to a read command and block application of a clock signal to a FIFO register when a precharge or power-down command is applied after application of the read command. As a result, the semiconductor memory device can save power without causing malfunctions.

The foregoing is illustrative of exemplary embodiments and is not to be construed as limiting thereof. Although practical exemplary embodiments have been described, those skilled in the art will readily appreciate that many modifications are possible without materially departing from the present inventive concept. Accordingly, the exemplary embodiments disclosed herein, all such modifications, as well as other embodiments, are intended to be included within the scope of the appended claims.

What is claimed is:

1. A semiconductor memory device including a latency controller, wherein the latency controller comprising:
   a clock generator configured to generate a plurality of transmission clock signals and to generate a plurality of sampling clock signals, each sampling clock signal delayed for a time corresponding to a set read latency with respect to the corresponding one of the transmission clock signals;
   a first-in first-out (FIFO) register configured to store an internal read signal in response to at least one sampling clock signal of the sampling clock signals and to generate a latency signal in response to a transmission clock signal corresponding to the sampling clock signal for storing the internal read signal; and
   a clock blocking unit configured to block application of the sampling clock signal to the FIFO register in response to a power-down signal and to block application of the transmission clock signal to the FIFO register when the power-down signal is applied to the clock blocking unit and a number of times the internal read signal is applied is equal to a number of times the latency signal is applied.

2. The device of claim 1, wherein the clock blocking unit comprises:
   a power-saving signal generator configured to enable a power-saving command signal when the power-down signal is applied and to enable a power-saving read signal when the power-saving command signal is enabled and a number of times the internal read signal is applied is equal to a number of times the latency signal is applied;
   a first gate unit including a plurality of sampling switches, each sampling switch configured to block application of the corresponding sampling clock signal to the FIFO register in response to the power-saving command signal; and
   a second gate unit including a plurality of transmission switches, each transmission switch configured to block application of the corresponding sampling clock signal to the FIFO register in response to the power-saving read signal.

3. The device of claim 2, wherein the power-saving signal generator enables the power-saving command signal in response to a precharge signal.

4. The device of claim 3, wherein the power-saving signal generator comprises:
   a first counter configured to count a number of times the internal read signal is enabled in response to the internal clock signal and to output a first counting value;
   a second counter configured to count a number of times the latency signal is enabled in response to a data output clock signal and to output a second counting value;
   a comparator configured to enable an equivalent signal when the first and second counting values are equal;
   an OR gate configured to perform a logic OR on the precharge signal and the power-down signal and to enable the power-saving command signal; and
   an AND gate configured to perform a logic AND on the power-saving command signal and the equivalent signal and to enable the power-saving read signal.

5. The device of claim 4, wherein the FIFO register comprises:
   a plurality of input switches, each input switch configured to transmit the internal read signal in response to the corresponding one of the sampling clock signals applied from the first gate unit;
   a plurality of buffers, each buffer configured to store the internal read signal applied from the corresponding one of the input switches and to be reset in response to the power-saving read signal; and
   a plurality of output switches, each output switch configured to receive the stored internal read signal from the corresponding one of the buffers in response to the corresponding one of the transmission clock signals applied from the second gate unit and to output the stored internal read signal as the latency signal.

6. The device of claim 5, further comprising:
   a memory cell array including a plurality of memory cells interposed between a plurality of word lines and a plurality of bit lines;
   a row decoder configured to decode a row address and to enable the corresponding one of the word lines;
   a column decoder configured to decode a column address and to select a predetermined number of bit lines out of the bit lines;

a clock synchronous circuit configured to receive an external clock signal and to generate the internal clock signal and the data output clock signal;

a command decoder configured to decode an externally applied command and to output the internal read signal, the precharge signal, the power-down signal, and a mode register set (MRS) signal;

a mode-setting unit configured to externally receive a mode-setting code in response to the MRS signal and to set the read latency; and a data input/output (I/O) unit configured to output data from the memory cell array, in response to the latency signal.

7. The device of claim 6, wherein the clock generator comprises:

a transmission clock generator configured to output the transmission clock signals that sequentially toggle in response to the data output clock signal and the set read latency;

a reproduction delay unit configured to receive one of the transmission clock signals, to delay the received transmission clock signal for a time corresponding to the sum of a read delay time and an output delay time, and to output a delay clock signal; and a sampling clock generator including a plurality of sampling flip-flops connected in cascade and configured to sequentially delay the delay clock signal and to output the sampling clock signals in response to the internal clock.

8. The device of claim 7, wherein the transmission clock generator comprises:

a plurality of transmission flip-flops connected in cascade, each transmission flip-flop configured to output the corresponding one of the transmission clock signals in response to the data output clock signal; and a plurality of latency switches, each latency switch configured to apply the transmission clock signal, which is applied from the corresponding one of the transmission flip-flops, to a first-stage transmission flip-flop in response to the set read latency.

9. The device of claim 8, wherein the sampling clock generator includes a plurality of sampling flip-flops connected in cascade and configured to sequentially delay the delay clock signal in response to the internal clock signal and to output the respectively corresponding sampling clock signals.

10. The device of claim 9, wherein the sampling clock generator includes the sampling flip-flops provided in a number corresponding to a maximum value of the read latency, and the transmission clock generator includes the transmission flip-flops provided in a number corresponding to the maximum value of the read latency.

11. A semiconductor memory device comprising:

a memory cell array having a plurality of memory cells interposed between a plurality of word lines and a plurality of bit lines to store data;

a data input/output unit coupled to the memory cell array and configured to output data from a memory cell of the memory cell array in response to a read command applied to the semiconductor memory device; and a latency controller for controlling the output of data from the data input/output unit and comprising a first-in first-out register coupled to the data input/output unit, wherein upon the read command being applied to the semiconductor memory device, the latency controller is configured to control the output of data from the data input/output unit by outputting from the first-in first-out register to the data input/output unit a latency signal based upon a set read latency for the semiconductor memory device and corresponding to the applied read command.

12. The semiconductor memory device of claim 11, wherein the latency controller further comprises:

a transmission clock signal generator coupled to the first-in first-out register that provides transmission clock signals to the first-in first-out register in response to a data output internal clock signal based upon an external clock signal; and a sampling clock generator coupled to the first-in first-out register that provides sampling clock signals to the first-in first out register in response to a delayed clock signal based upon a delayed first transmission clock signal.

13. The semiconductor memory device of claim 12, further comprising:

a first gate unit coupled between the sampling clock generator and the first-in first-out register; and a second gate unit coupled between the transmission clock generator and the first-in first-out register, wherein upon the read command being applied to the semiconductor memory device and in response to a precharge command or a power-down command, the first gate unit is configured to block application of the sampling clock signals to the first-in first-out register and the second gate unit is configured to block application of the transmission clock signals to the first-in first-out register.

14. The semiconductor memory device of claim 12, further comprising a command decoder for providing an internal read signal to the latency controller based upon the read command, wherein the first-in first-out register is configured to sample the internal read signal and store the sampled signal in response to the sampling clock signals and output the stored sampled signal as the latency signal in response to the transmission clock signals.

15. The semiconductor memory device of claim 12, wherein the delayed clock signal is delayed by the latency controller for a time corresponding to a set read latency with respect to a corresponding one of the transmission clock signals.

16. The semiconductor memory device of claim 14, wherein the first transmission clock signal is delayed by a delay time corresponding to a sum of a read delay time and a data output delay time, the read delay time being a time taken for the command decoder to output the internal read signal in response to the read command, and the data output delay time being a time taken for the data input/output unit to externally output data received from the memory cell array.

* * * * *